United States Patent [19]

Jennion et al.

[11] Patent Number: 5,778,004
[45] Date of Patent: Jul. 7, 1998

[54] VECTOR TRANSLATOR

[75] Inventors: Mark W. Jennion, Chester Springs; Patrick A. Edwards, Philadelphia, both of Pa.

[73] Assignee: Unisys Corporation, Blue Bell, Pa.

[21] Appl. No.: 794,174

[22] Filed: Feb. 3, 1997

Related U.S. Application Data

[63] Continuation of Ser. No. 458,344, Jun. 2, 1995, abandoned.

[51] Int. Cl.⁶ ................................................. G01R 31/28
[52] U.S. Cl. .......................................... 371/22.1; 371/27.1
[58] Field of Search ................................. 371/22.1, 27.1, 371/27.4, 27.5; 395/421.08, 500; 364/578; 324/765

[56] References Cited

U.S. PATENT DOCUMENTS

| | | | |
|---|---|---|---|
| 4,348,759 | 9/1982 | Schnurmann | 371/20 |
| 4,606,025 | 8/1986 | Peters et al. | 371/20 |
| 4,736,375 | 4/1988 | Tannhauser et al. | |
| 4,766,595 | 8/1988 | Gollomp | |
| 4,860,291 | 8/1989 | Damm et al. | 371/27 |
| 4,903,267 | 2/1990 | Arai et al. | |
| 4,977,531 | 12/1990 | Ogata et al. | |
| 5,001,418 | 3/1991 | Posse et al. | |
| 5,027,353 | 6/1991 | Jarwala et al. | |
| 5,029,171 | 7/1991 | Lee et al. | |
| 5,046,033 | 9/1991 | Andreasen et al. | |
| 5,323,401 | 6/1994 | Maston | |
| 5,345,450 | 9/1994 | Saw et al. | |
| 5,446,742 | 8/1995 | Vahabi et al. | 371/27 |

OTHER PUBLICATIONS

Tektronix User Manual for HFS 9000 Stimulus System 070–8365–01, cover and pp. i, ii, 3–1 and 3–2 (first printed Feb. 1992).

Tektronix User Manual for BitWriter™ 070–8859–00, cover and pp. A–1, A–2 and B–1 (first printed Aug. 1993).

Logic Master XL Series Operator's Manual, Version V4.8, Part No. 910–0163–012, Integrated Measurement Systems, cover and pp. ii, v–vii, and ix–x and pp. 1–1 to 1–12 and 9–1 to 9–4 (copyright 1992).

Logic Master XL Series System Reference Manual, Version V4.8, Part No. 910–0164–013, Integrated Measurement Systems, cover and pp. ii, v, vii and viii and pp. 1–1 to 1–3, 2–1 to 2–4 and 4–1 to 4–4 (copyright 1992).

*Primary Examiner*—Robert W. Beausoliel, Jr.
*Assistant Examiner*—Nadeem Iqbal
*Attorney, Agent, or Firm*—John B. Sowell, Esq.; Mark T. Starr, Esq.; John F. O'Rourke, Esq.

[57] ABSTRACT

A technique for accepting test vectors in one format, generally proven to operate correctly, from an IC tester such as the Logic Master XL2 ("off-bench tester") and processing/converting them into another format for use in a stimulus generator such as the HFS 9009 for bench top testing. The process, which in the exemplary embodiment is implemented in software, accepts various parameters as inputs (e.g., channel name(s) for stimulus generator, range of vectors, etc.) for purposes of extraction and translation. The process provides an Interface and Initialization Unit (IIU) and a Translator Unit (TU). The IIU provides a user interface necessary for a user to select the various options available. In addition, the IIU coordinates the use of memory, file I/O and communication with the active files on the off-bench tester. The IIU verifies user selections and does error checking. Once complete, the TU translates the selected signals for the vector range entered by the user. Data is temporarily stored in memory and then written to a VCA format output file in records. Additionally, the TU automatically expands all encountered pattern instructions (e.g., REPEAT, LOOP, etc.) into equivalent vectors before writing to memory. The TU also does verification and error checking. Once the TU 112 generates a completed VCA file, the vectors are ready to be downloaded to the stimulus generator.

5 Claims, 12 Drawing Sheets

*Figure 5A*

| OLD SEQ# | OLD CYC# | NEW SEQ# | 1 of N | 2 of N | GACLK | 9 of N | GCCLK | 9 of N | TRIGR |   |
|---|---|---|---|---|---|---|---|---|---|---|
| 1 | 4  | 0  | 1 | 1 | 1 | 1 | 1 | 1 | 0 | ;\*\*\*\*\*\*\*COMMENT\*\*\*\*\*\*\* |
| 1 | 5  | 1  | 1 | 1 | 1 | 1 | 1 | 1 | 0 | ;ILLUSTRATING GROUP |
| 2 | 6  | 2  | 1 | 1 | 0 | 1 | 0 | 1 | 0 | ;AND SEQUENCE SELECTION |
| 3 | 7  | 3  | 0 | 0 | 1 | 0 | 0 | 0 | 0 | ;IN EXPANDED FORM. |
| 2 | 8  | 4  | 1 | 1 | 0 | 1 | 0 | 1 | 0 | ;7 GROUPS EXTRACTED |
| 3 | 9  | 5  | 0 | 0 | 1 | 0 | 0 | 0 | 1 | ;SEQUENCE 1 – 9 SELECTED |
| 4 | 10 | 6  | 0 | 0 | 0 | 0 | 1 | 1 | 0 | ;CYCLES 4 THROUGH 21 |
| 5 | 11 | 7  | 0 | 0 | 0 | 0 | 1 | 1 | 0 |   |
| 6 | 12 | 8  | 0 | 0 | 0 | 0 | 0 | 1 | 0 |   |
| 7 | 13 | 9  | 1 | 1 | 0 | 1 | 0 | 1 | 0 |   |
| 7 | 14 | 10 | 1 | 1 | 0 | 1 | 1 | 1 | 0 |   |
| 8 | 15 | 11 | 1 | 1 | 0 | 0 | 1 | 1 | 0 |   |
| 5 | 16 | 12 | 0 | 0 | 0 | 0 | 0 | 1 | 0 |   |
| 6 | 17 | 13 | 0 | 0 | 0 | 1 | 0 | 1 | 0 |   |
| 7 | 18 | 14 | 1 | 1 | 0 | 0 | 0 | 1 | 0 |   |
| 7 | 19 | 15 | 1 | 1 | 0 | 0 | 0 | 1 | 0 |   |
| 8 | 20 | 16 | 0 | 0 | 1 | 0 | 1 | 0 | 0 |   |
| 9 | 21 | 17 | 0 | 0 | 0 | 0 | 0 | 0 | 0 | : HALT |

*Figure 5B*

:FPAN:VRADIX DEC
:PGENA:CH1:SIGNAL "IN_01" ;CVIEW CHANNEL;DRADIX BIN
:PGENA:CH1:DATA 0, 17, "11101000011001110"
:PGENA:CH2:SIGNAL "IN_02" ;CVIEW CHANNEL;DRADIX BIN
:PGENA:CH2:DATA 0, 17, "11101000011001110"
:PGENA:CH3:SIGNAL "GACLK" ;CVIEW CHANNEL;DRADIX BIN
:PGENA:CH3:DATA 0, 17, "11010100000000001"
:PGENA:CH4:SIGNAL "IN_09" ;CVIEW CHANNEL;DRADIX BIN
:PGENA:CH4:DATA 0, 17, "11101000110001100"
:PGENB:CH1:SIGNAL "GCCLK" ;CVIEW CHANNEL;DRADIX BIN
:PGENB:CH1:DATA 0, 17, "11000001100110001"
:PGENB:CH2:SIGNAL "IN_19" ;CVIEW CHANNEL;DRADIX BIN
:PGENB:CH2:DATA 0, 17, "11101011111111110"
:PGENB:CH3:SIGNAL "TRIGR" ;CVIEW CHANNEL;DRADIX BIN
:PGENB:CH3:DATA 0, 17, "00000001000000000"
:VECTOR:START 0
:VECTOR:LOOP 0
:VECTOR:END 17
:FPAN:SORDER "IN_01","IN_02","GACLK","IN_09","GCCLK","IN_19","TRIG",

*Figure 5C*

VECTOR TRANSLATOR

This application is a continuation of application Ser. No. 08/458,344 filed on Jun. 2, 1995, now abandoned.

FIELD OF THE INVENTION

The present invention generally relates to integrated circuit chip testing and, more particularly, the present invention relates to, when using more than one testing configuration, translating test vectors from a format used in a first test configuration to a format suitable for use in a second test configuration.

BACKGROUND OF THE INVENTION

As semiconductor technology progresses, it is well known that integrated circuits (ICs) continue to become more dense (i.e., contain more and more transistors) and, thus, contain circuits which are more and more complex.

It is also well known that, before these complex ICs, whether custom, semi-custom or even off-the-shelf, are incorporated into expensive, complicated projects, they need to be tested. That is to say, the ICs are passed through series of tests which simulate, using sequences of test vectors, the environment in which the ICs will exist once incorporated into a product. Additionally, other types of diagnostic tests may also be conducted.

In the past, to verify the integrity of an IC, test data was loaded into a stimulus generator by hand and debugged manually. This process was somewhat manageable since early devices were small and less complicated. However, with the rapid pace of progress in the semiconductor field, the extremely high densities and complexities of current devices would make such a process extremely difficult and time consuming.

Clearly, the task of conducting IC tests for dense and complex ICs is not an easy one. To address this, various companies manufacture and sell specific equipment to aid in the testing of the ICs. For example, Integrated Measurement Systems (IMS), Inc. produces an IC tester, known as the Logic Master XL2 (also referred to herein as an "off-bench tester"), which allows a user to download a set of test vectors in an IMS format which can then be applied to an IC for testing purposes. Of course, the IC needs to be properly connected to the Logic Master XL2 via a circuit board having the appropriate connections. As the test vectors are applied during the tests, the Logic Master XL2 can also capture select outputs from the IC to determine if the IC is working as expected.

Although generally an off-bench tester provides a fair amount of flexibility, this type of tester, has several drawbacks. For example, these include its speed limitations (i.e., the speed at which the tester can provide/capture data to/from an IC). Some ICs are designed to run at very high speeds such as a phase-locked loop device. Because such a device is designed to operate at speeds greater than the off-bench tester can handle, such a device cannot be properly tested at the appropriate speeds. Certainly, ICs of this type can be tested at lower speeds for partial verification of its functionality, but it is equally important that the ICs are tested under real operating conditions. Another drawback of off-bench testers is the lack of IC access. That is, the IC is usually mounted onto a board which is mounted onto the tester leaving little room for access to various points on the IC not already connected to a point on the circuit board.

To overcome these drawbacks, other types of equipment are available which, although having drawbacks of their own (i.e., lack of flexibility), are well suited for providing the speed and access needed for bench top testing. Bench top testing is very important. In fact, because bench top testing provides a more realistic emulation of the environment in which the IC will operate (e.g., operating conditions such as speeds and loading), bench top tests can be as much as ten times more accurate than measurements made for some ICs on IC testers like the off-bench testers.

For bench top testing, Tektronix produces a stimulus generator known as the HFS 9009 Stimulus System. The HFS 9009, using its own vector format and different from the IMS format, can deliver test vectors to an IC, mounted to a circuit board, at very high speeds (e.g., 640 MHz) allowing for full functional verification. Additionally, the HFS 9009 can provide for control of other equipment integrated into the test environment such as an oscilloscope and/or data acquisition unit to be used during testing. As with the Logic Master XL2, test vectors in an appropriate format can be downloaded to the HFS 9009 by a personal computer. The HFS 9009, however, does not provide the flexibility of easily modifying vectors and quickly reviewing test results related to such changes. Additionally, there are cost concerns when using an HFS 9009, for example, in addition to the stimulus generator itself, each channel (i.e., source of a single signal) costs approximately $1,000 with a maximum of 64 channels available.

Accordingly, in many engineering labs around the world, multiple test configurations exist such that, for example, vector generation and partial functional verification is completed in one configuration and additional, perhaps final, functional verification is accomplished using another configuration. A major drawback of a test environment having multiple test configurations is the incompatibility of test vectors. One configuration may be able to handle many signals and many vectors and another environment may only be able to handle a few signals and only a few vectors. Moreover, the formats of the vectors generally vary between test equipment produced by different manufacturers.

Conventional translators can only convert an entire test from one format into another format. This entire conversion includes data for all signals, all pattern instructions from each vector and does it for all vectors in the test. The final result is the exact same test but essentially in a different language. However, generally, bench equipment lacks the necessary vector memory and pin resources to make use of all this information.

Thus, it is desirable to provide an easy, fast and convenient way to make multiple, different test configurations work together. Additionally, there is a need for flexibility in the conversion so to reduce the size of a test by extracting only a specific portion of the test (i.e., signals and/or test vectors) a user desires.

SUMMARY OF THE INVENTION

The present invention involves an integrated circuit (IC) test environment which includes at least two test configurations where each test configuration employs a different test vector format. The present invention is for processing a first set of test vectors having a first format used in a first test configuration to a second set of test vectors in a second format to be used in a second test configuration, wherein both the first and second set of test vectors include at least one signal and at least one test vector. The present invention includes means for receiving user selections representing at least one of a desired set of signals and a desired range of test vectors to be processed from the first set of test vectors, the at least one of the desired set of signals and the desired range of test vectors is less than the total number of signals and test vectors, respectively, in the first set of test vectors; means for extracting data related to the user selections from the first set of test vectors; and means for converting the extracted data into the second set of test vectors in the second format.

BRIEF DESCRIPTION OF THE DRAWINGS

The invention is best understood from the following detailed description when read in connection with the accompanying drawings, in which:

FIG. 5A is a table illustrating a typical IMS format set of test vectors.

FIG. 5B is a subset of the table illustrated in FIG. 5A conceptually showing user selected signals and test vectors based on user selected inputs.

FIG. 5C is a table illustrating the output, in VCA format, of the present invention having processed the user selected inputs and the IMS format set of test vectors shown in FIG. 5A.

DETAILED DESCRIPTION

Overview

The present invention takes test vectors in one format, generally proven to operate correctly, from an IC tester such as the Logic Master XL2 ("off-bench tester") and processes/converts them into another format for use in a stimulus generator such as the HFS 9009 for bench top testing. For purposes of the following description, the test vector format used by the off-bench tester is referred to as an IMS format and the test vector format used by the bench top tests is referred to as VCA format although the present invention is equally applicable to hybrid test configurations using other test vector formats.

Figure 1:
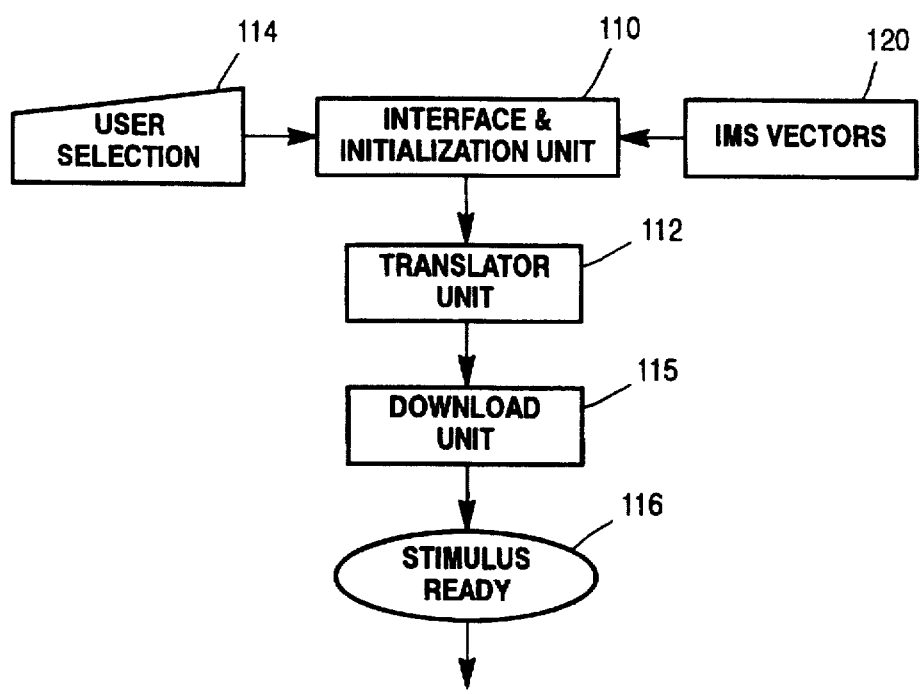
FIG. 1 is a high-level flowchart diagram of an exemplary embodiment of the present invention.

Referring to FIG. 1, for example, a high level flow diagram of the present invention is illustrated. Generally, the present invention extracts and then translates IMS format vectors 120 into vectors suitable for downloading into bench top stimulus generators 116 that use VCA format. The present invention, which in the exemplary embodiment is implemented in software as a 'C' program, accepts various parameters as inputs (e.g., the channel name(s) and the range of vectors to extract and translate). It should be noted that it is contemplated that other programming languages may be used to implement the present invention. Additionally, the program can be stored on a disk or other storage media from which the program can be loaded/executed.

Continuing with FIG. 1, the present invention includes an Interface and Initialization Unit (IIU) 110 and the Translator Unit (TU) 112. The IIU 110 provides the user interface necessary for a user to select various options such as which signals and the range of vectors to be processed (selections block 114). In addition, the IIU 110 coordinates the use of memory, file I/O and communication with the active files on the off-bench tester. The IIU 110 also verifies that all the user selections are valid and does all necessary error checking.

Once this is complete, TU 112 begins translating the desired signals for the vector range entered by the user. Data is temporarily stored in memory and then written to a VCA output file in records. This is continued until the desired end vector is reached. The TU 112 automatically expands all encountered pattern instructions (e.g., REPEAT, LOOP, etc.) into equivalent vectors before writing to memory. If the TU 112 encounters an invalid pattern instruction, it reports the vector location, the error condition and then halts the program.

Once the TU 112 generates a completed VCA file, the Download Unit (DU) 115 transfers the data to the instrument. This unit coordinates communication with the instrument and checks for error conditions. After completion the stimulus generator is ready for use 116.

An important advantage provided by the present invention is that it allows for test vectors, proven to be good in the IMS environment, to be quickly and reliably processed and transferred to bench top test equipment (VCA format) for critical measurements, thereby minimizing, if not eliminating, the need for manual work and the likelihood of human error.

It should be noted that, although the present invention is in part described below in terms of particular off-bench and bench top testers, the present invention is not limited to the particular examples and is equally applicable to IC test environments using similar types of hybrid test configurations including at least two different types of test vector formats.

DETAILED DESCRIPTION OF THE EMBODIMENT

Figure 2A:
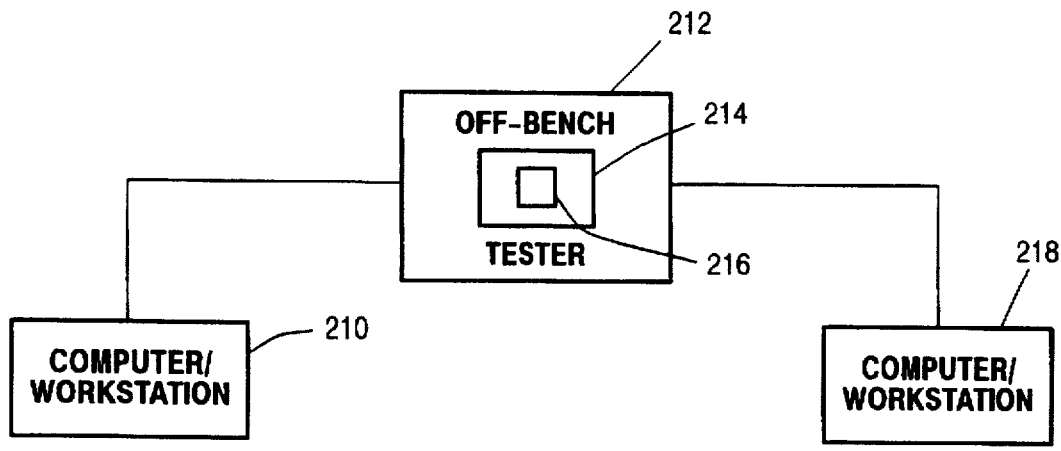
FIG. 2A is a high-level functional block diagram of an exemplary off-bench test configuration suitable for use with the present invention shown in FIG. 1.
Figure 2B:
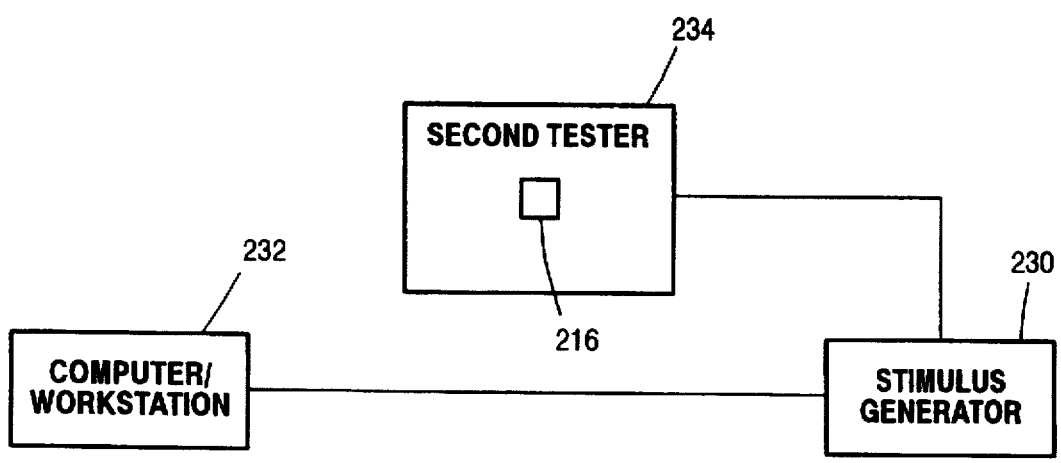
FIG. 2B is a high-level functional block diagram of an exemplary bench top test configuration suitable for use with the present invention shown in FIG. 1.

Turning to FIGS. 2A and 2B, an exemplary hybrid test environment is illustrated. In FIG. 2A, an off-bench configuration is depicted including a computer/workstation 210 such as a personal computer (PC) or SUN workstation used for generating the vectors in IMS format to be used by the off-bench tester 212 such as the Logic Master XL2. It should be noted that the connection between computer/workstation 210 to off-bench tester 212 may be, for example, an Ethernet connection, a general purpose interface bus (GPIB) connections or the like. As shown, off-bench tester 212 includes a circuit board 214 on which resides the IC 216 under test. Circuit board 214 provides various connections between off-bench tester 212 and IC 216. In this particular illustration, a second computer/workstation 218 such as a PC is connected, via a GPIB connection, to off-bench tester 212. The exemplary embodiment of the present invention executes on the second computer/workstation 218 where it communicates with off-bench tester 212 to extract IMS vectors, process them and produce VCA format vectors. The user interface with the present invention, and the extraction and processing of the IMS vectors is described in detail below.

Once the VCA vectors are produced, they are downloaded to the stimulus generator 230. In the configuration shown in FIGS. 2A and 2B, this is accomplished by storing the VCA vectors on a floppy disk (not shown) and carrying the floppy disk to a computer/workstation 232 which is connected, via a GPIB connection, to the stimulus generator 230. This type of data transfer (i.e., carrying a floppy disk from one computer to the next) is also known as using the "sneakernet". It should be noted, however, that other suitable techniques for transferring this data are also contemplated such as connecting computer/workstation 218 directly to stimulus generator 230 or connecting computer/workstation 218 to computer/workstation 232 via a local area network (LAN) connection or other suitable interconnections which provide for the necessary transfer of data.

Once the floppy disk with the vectors are loaded onto computer/workstation 232, they are downloaded to stimulus generator 230. This can be accomplished using custom software or, for use with HFS 9009, Tektronix produces a software product known as BitWriter. BitWriter provides limited editing capabilities for vector files in a VCA format and also provides for downloading the test vectors to stimulus generator. Now the tests can be run and, with the aid of oscilloscopes (not shown), data acquisition units (not shown) and other bench top test equipment, various signals can be monitored, captured and/or analyzed.

Figure 3:
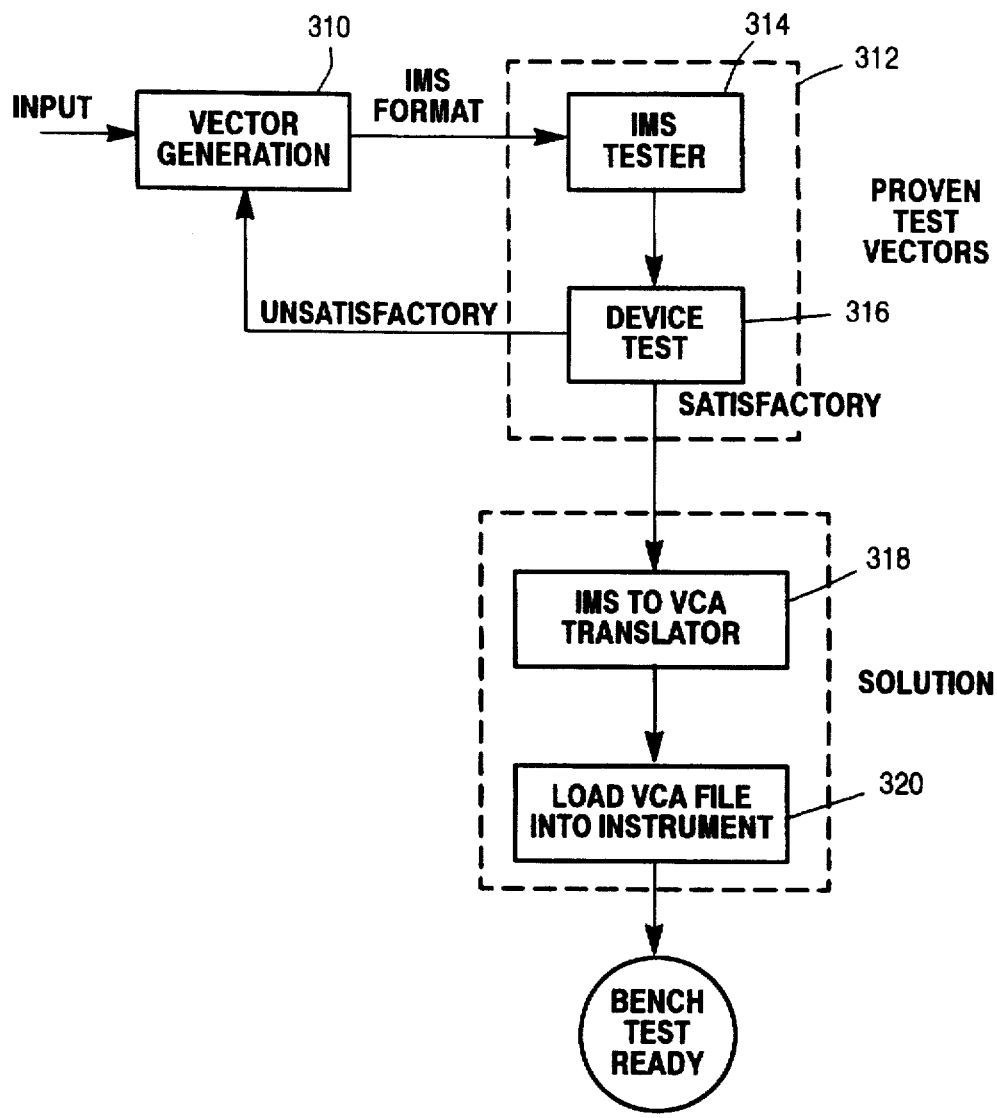
FIG. 3 is another high-level flowchart diagram illustrating how the present invention may be used.

FIG. 3 is another exemplary high-level flow diagram illustrating a typical flow of operation for a test environment in which the present invention operates. As shown, at functional block 310, test vectors in the IMS format are created and stored, for example, in a *.IMS file. In the exemplary embodiment of the present invention, this can be accomplished manually or automatically (e.g., using a test vector editor) or a combination of both.

Once created, the test vectors are downloaded to the IMS tester, block 314, applied to the IC being tested, block 316, and the results are reviewed. If the results are unsatisfactory, the process returns to vector generation block 310 where the test vectors in the IMS format can be modified or rewritten, downloaded and run again. This step is repeated as often as necessary. However, once satisfactory test vectors are found, they can then be processed, translated and used in the bench top test configuration.

In FIG. 3, this is represented by the arrow from block 316 to block 318—IMS to VCA TRANSLATOR. As mentioned above, here select IMS format vectors are translated to the VCA format, block 318, and stored, for example, in a *.VCA file. Then, the VCA format vectors are downloaded to the stimulus generator, block 320. And, the bench top test is ready to run.

Referring to FIGS. 4A–4E, additional details of the present invention are described. FIGS. 4A–4E show an exemplary flowchart diagram of the present invention.

As described in detailed below with reference to FIGS. 4A–4E, the present invention provides several important features including:

1) The ability to extract a subset of signals from the test. That is, it can extract and create smaller specific tests using as little as one signal.

2) The ability to extract a subset of vector sequences. That is, it can extract and translate data for any valid range of vector sequences from the test.

3) The ability to expand pattern instructions into their equivalent vector sequences. That is, when, for example, a "Repeat" or "Loop" pattern instruction is encountered, the vector sequence is expanded into its equivalent vectors.

4) The ability to extract test vector information directly from memory in the off-bench tester.

Figure 4A:
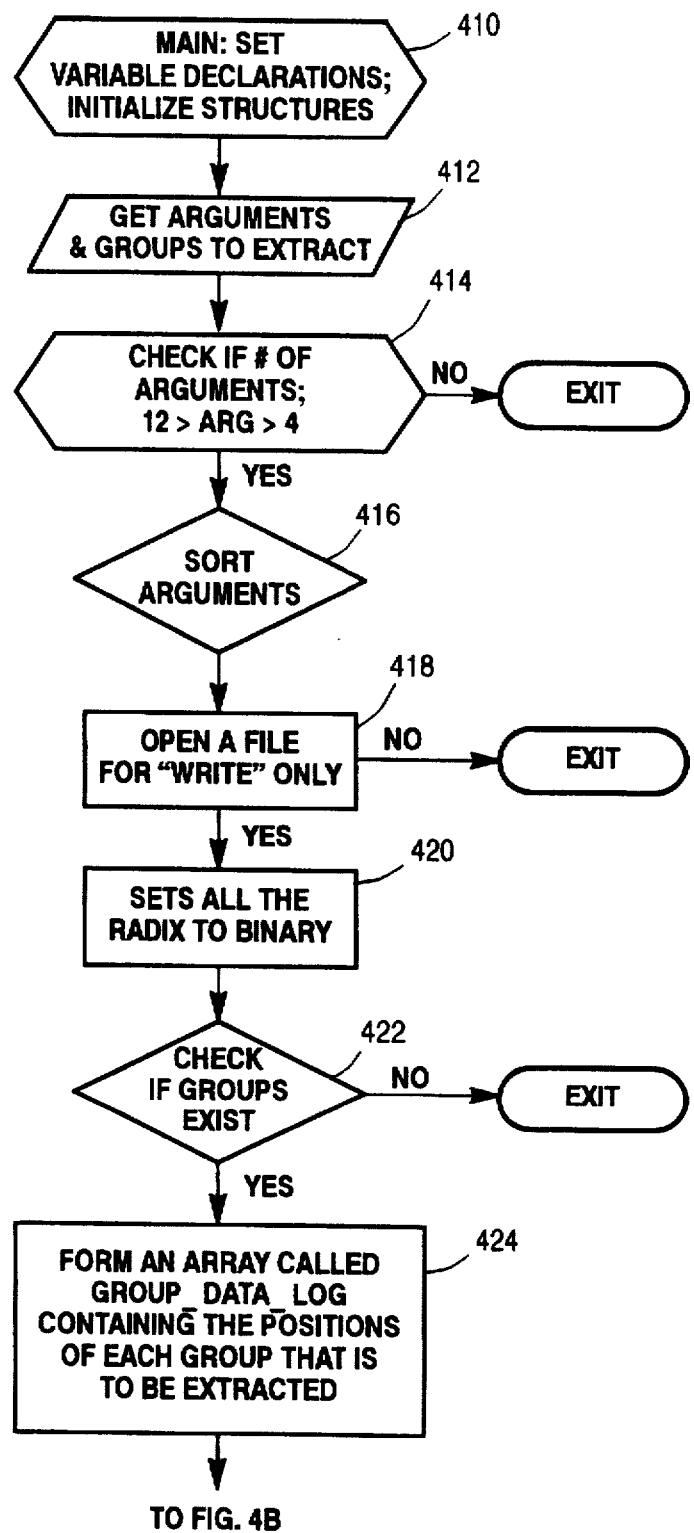
FIGS. 4A, 4B, 4C, 4D and 4E show a flowchart diagram of an exemplary embodiment of the present invention.

Beginning with FIG. 4A, at step 410, the variables and structures used in the program are declared and initialized, respectively. At step 412, the process gets the user provided input parameters (arguments and other information) used for processing the test vector set in the IMS format and, in the exemplary embodiment, stored in the off-bench tester. For example, some typical user provided input parameters include the desired start and stop numbers for test vectors as well as the desired selected signals (or groups). These inputs allow for subsequent processing of less than the total number of test vectors and less than the total number of signals.

Continuing with FIG. 4A, the number of user provided arguments are check for errors. In the exemplary embodiment, if the number of arguments is less than 4 or greater than 12, the process exits otherwise it continues to step 416. At step 416, the user provided inputs are sorted. At step 418, a write only file is created for holding the output (VCA format vectors) generated by the present invention after processing the IMS format test vectors. At step 420, the data format in the off-bench tester is set to binary.

At step 422, the process checks to see if the signals (or groups) specified in the user provided inputs exist, for example, by matching names. If the groups exist, the process continues to step 424. If even one of the groups does not exist, the process delivers a message to the user indicating an improper group has been selected, it then lists the proper groups and exits. The process, at this step, lists the proper groups assuming that the user made a typographical error in selecting the group names.

At step 424, the process forms an array containing the positions of each group to be extracted. For example, there may be 20 signals designated in the IMS format test vector set but only 8 are going to be used in the bench top testing, thus, the array contains the positions of the 8 selected groups.

Figure 4B:
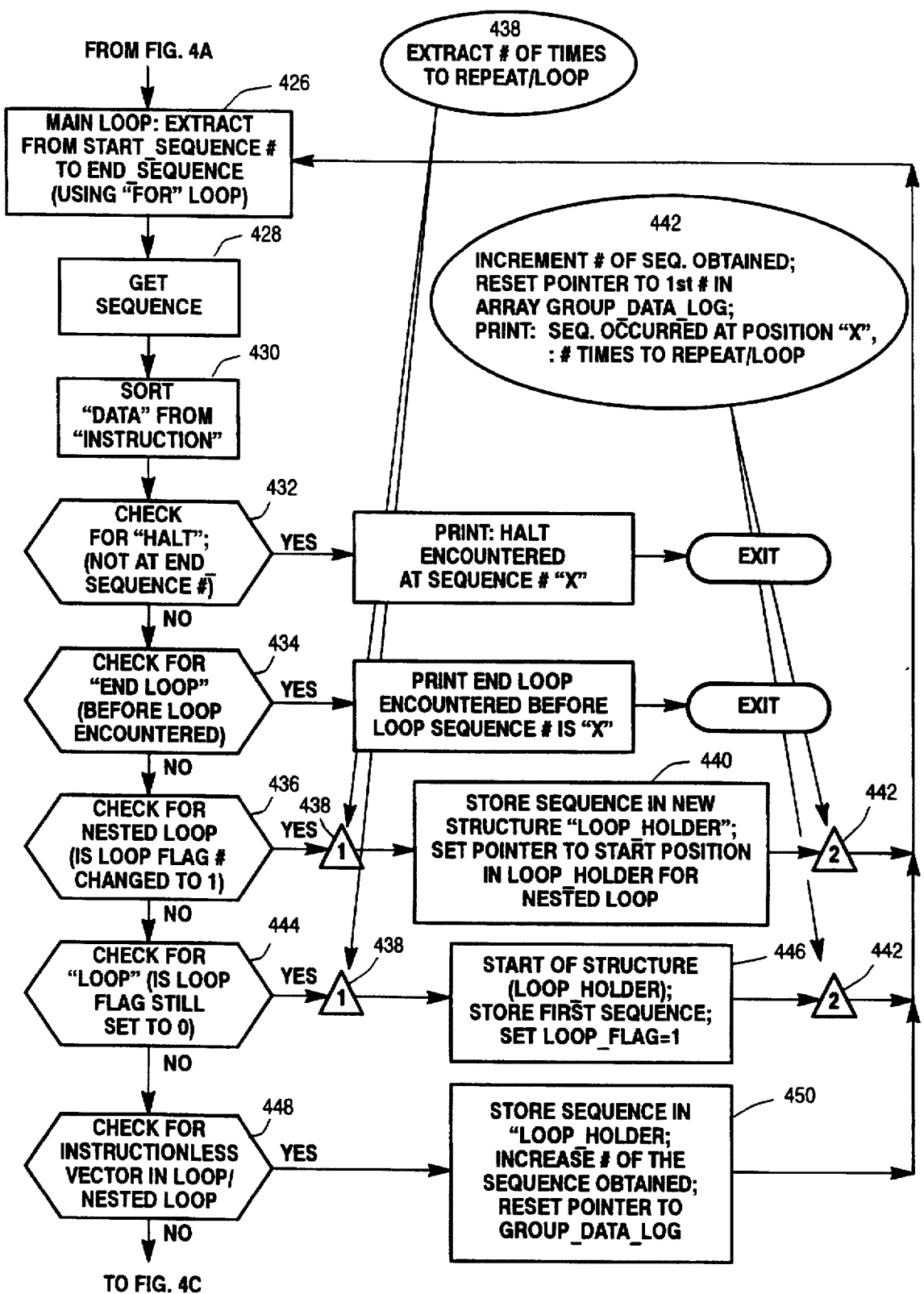

Referring to FIG. 4B, at step 426, the test vectors designated by the user provided inputs (i.e., the start and stop locations) are extracted one at a time. That is to say, step 426 signifies the beginning of the "MAIN LOOP" which performs the processing of each test vector in IMS format. Accordingly, each time through the MAIN LOOP, one IMS format test vector is retrieved, step 428.

Figure 5A:
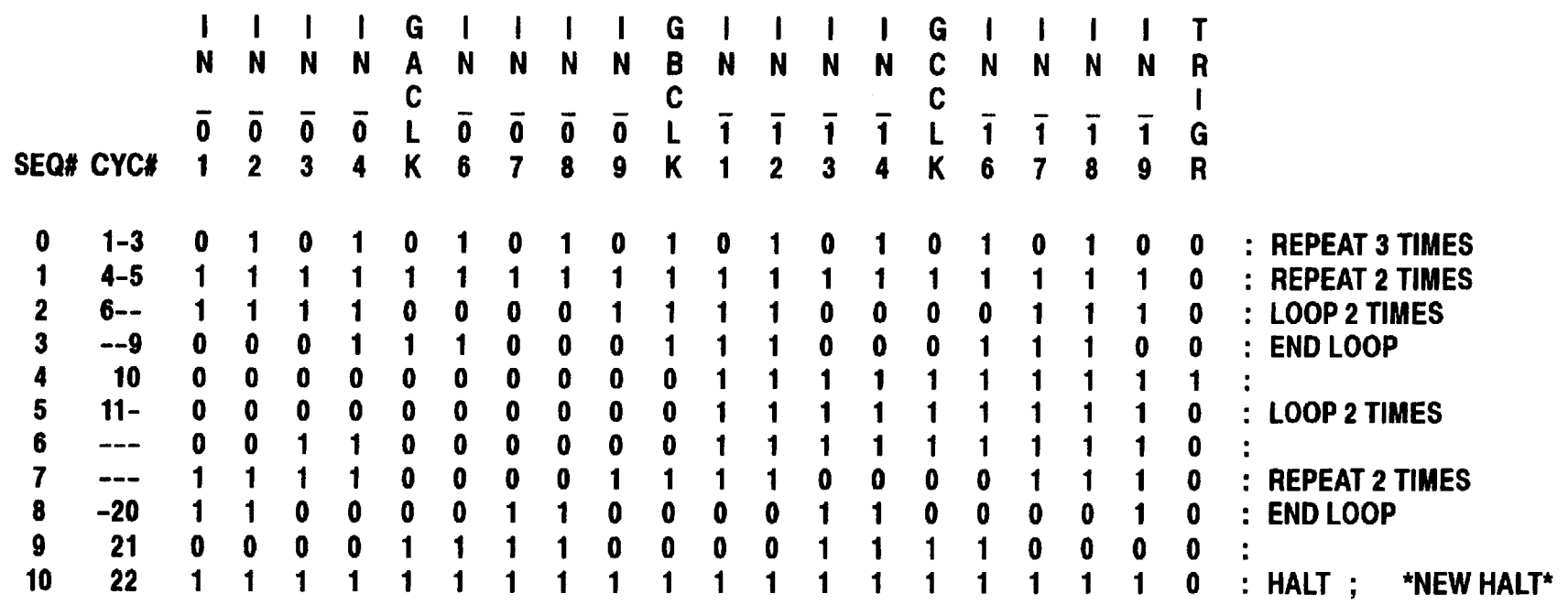

At step 430, the actual test vector data is separated from any instruction which may be used in the IMS format (see FIG. 5A). The process then reviews the instruction, if one exists, and if a "HALT" or "END LOOP" instruction is encountered before the end of sequence (step 432) or before a "LOOP" (step 434) is encountered, respectively, the process exists; otherwise the process passes to step 436.

At step 436, the process checks for a nested loop which, if encountered, is processed at steps 438, 440 and 442. It should be noted that steps 438 and 442, represented as triangles labelled with a "1" and a "2", each represent a series of steps to be performed when processing NESTED LOOPS, LOOPS and REPEAT instructions. As shown in FIG. 4E, step 438, signifies the extraction of the LOOP or REPEAT parameter (i.e., number of times loop is executed); and, step 442, increments the number of sequences obtained and resets the pointer for the group data array. Regarding step 440, the process stores the sequence number in a new structure for a NESTED LOOP and sets a pointer to the start position in a loop__holder structure.

As seen, the process essentially checks for the various conditions it may encounter with each IMS format test vector retrieved from the off-bench tester and processes the test vector accordingly (e.g., expanding loops into raw form).

At step 444, the process checks for a LOOP instruction and, if encountered, processes it accordingly, steps 438, 446 and 442.

If the test vector being processed is a test vector within a loop but without an associated instruction, step 448, it is simply processed, at step 450, by 1) storing the sequencing number in loop_holder structure, 2) increasing the sequence number obtained and 3) resetting the group data array pointer.

Figure 4C:
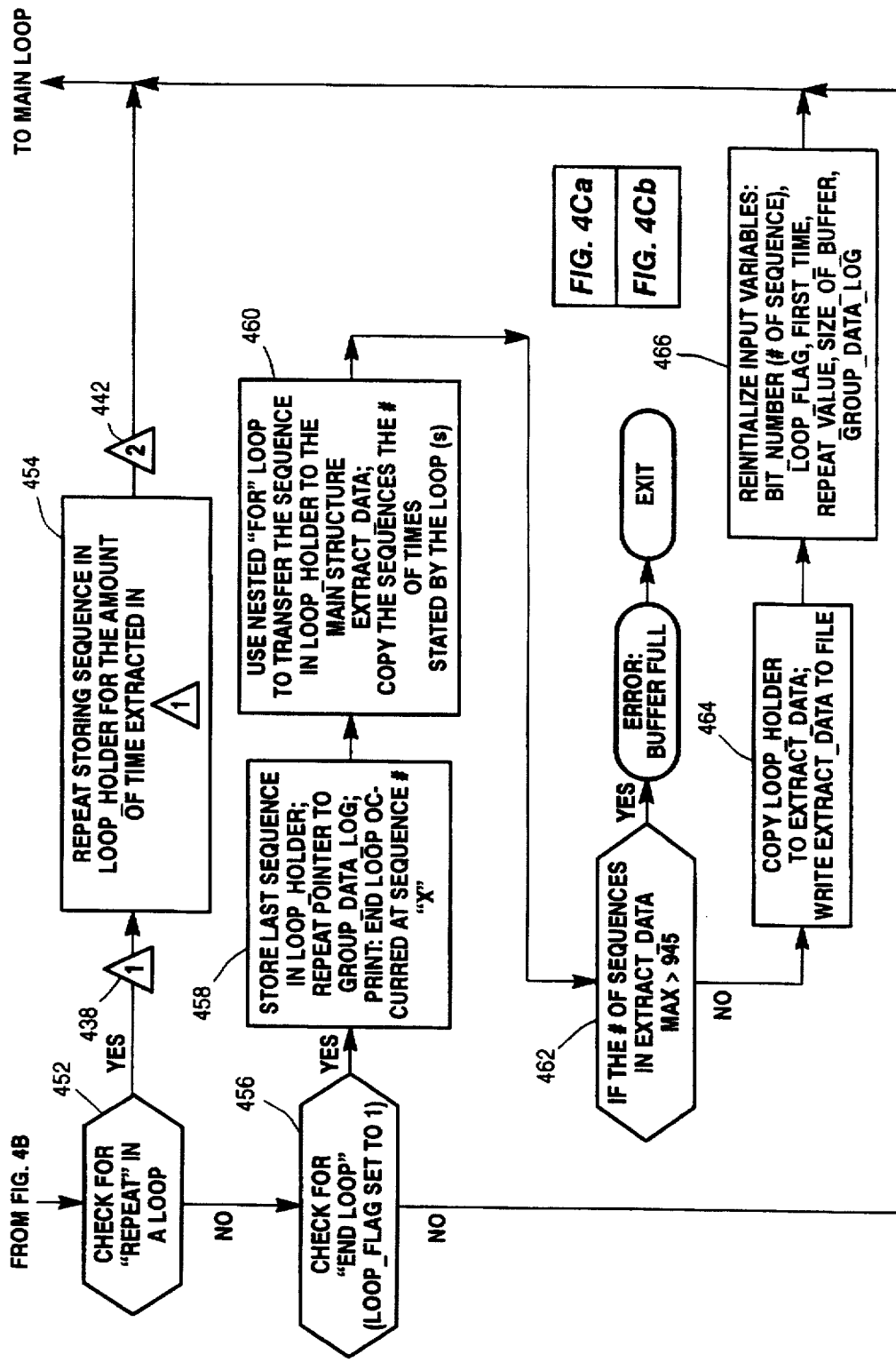
Figure 4C:
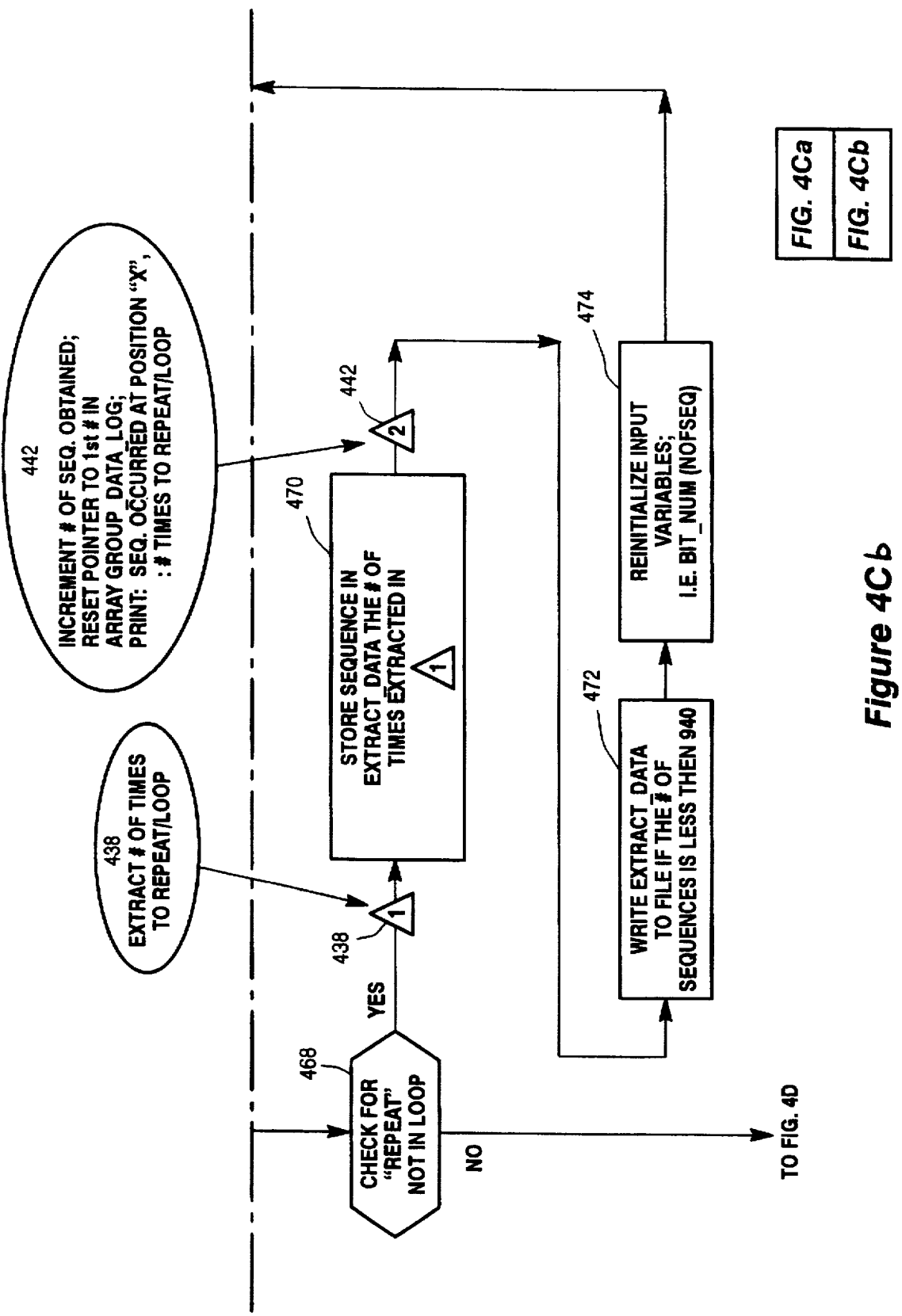

Turning to FIG. 4C, step 452 checks for a REPEAT within a LOOP; if encountered, the test vector to be repeated is expanded by steps 438, 454 and 442. Next, at step 456, an END LOOP is checked. If the END LOOP is encountered, all of the loop information previously gathered and stored is used for expanding the loop into raw test vectors, writing them to the VCA format test vector file and resetting/ modifying/clearing the variables and structures used to track and store the loop information, steps 458, 460, 462, 464 and 466.

Then, at step 468, it is determined whether the test vector presently being processed includes a REPEAT instruction which is not within a LOOP. If so, using steps 438, 470, 442, 472 and 474, the test vector is repeated accordingly.

Figure 4D:
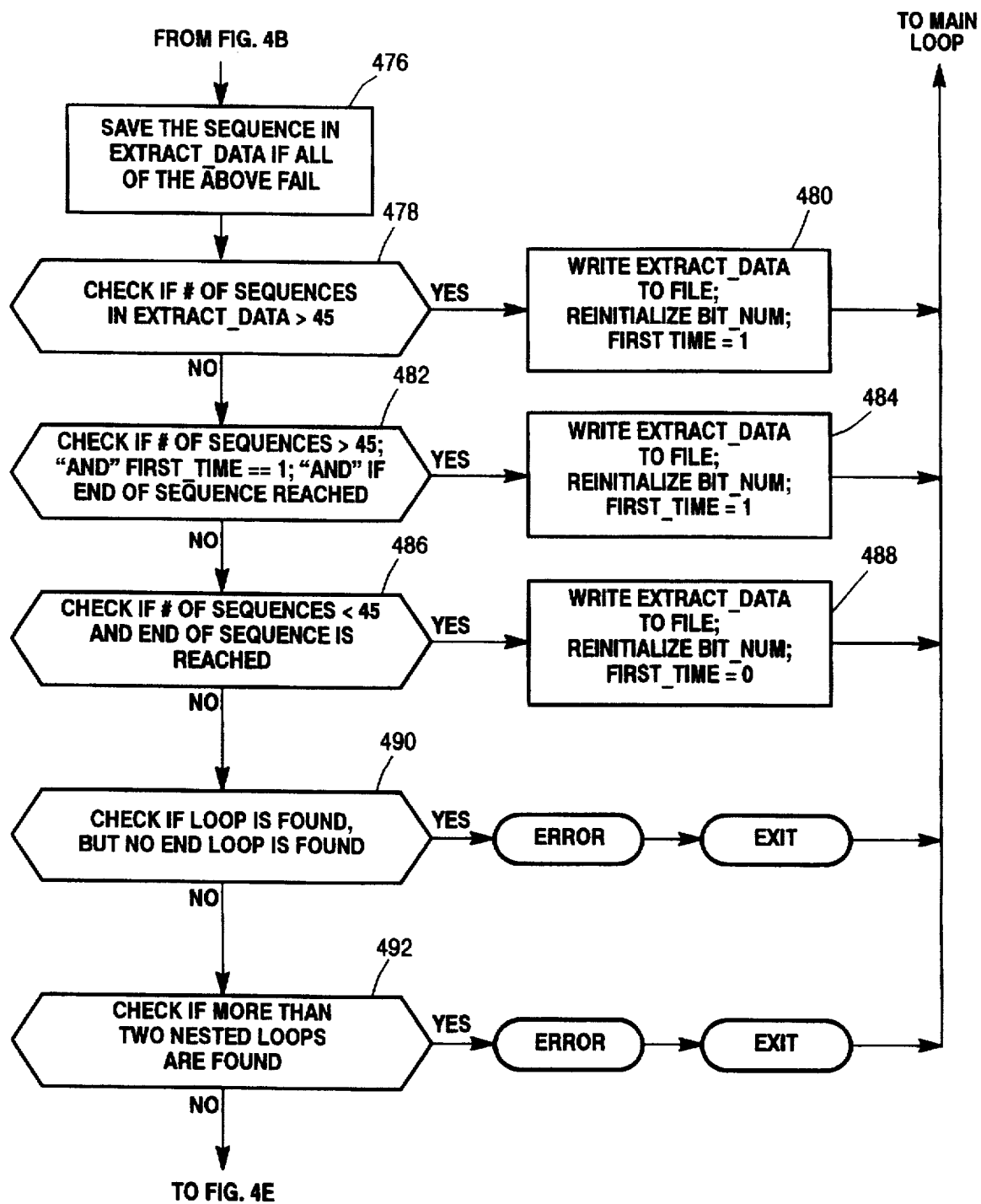
Figure 4E:
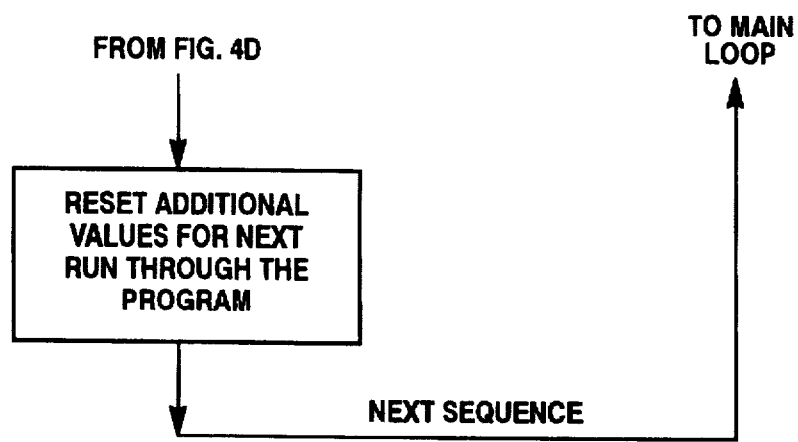

Referring to FIG. 4D, at step 476, the process saves the sequence in the EXTRACT_DATA structure if all of the checks fail.

Next, at steps 478 and 480, a check is made such that if the number of sequences in the EXTRACT_DATA structure is greater than 45, the group of sequences is written to the write only file. It should be noted that the EXTRACT_ DATA structure is a structure created for the temporary storage of sequence before writing them to the VCA format file. And, the number 45 is an arbitrary limit proven to be adequate through experimentation.

At step 482 and 484, another check is made to determine if the number of sequences is greater than 45 and whether this will be the first time data from EXTRACT_DATA is being written to the file (i.e., does first_time flag==1) and if the end sequence number has been encountered. Again, if the conditions are satisfied, the sequences stored in the EXTRACT_DATA structure are written to the VCA format file.

At step 486 and 488, the check is whether the number of sequences is less than 45 but the end sequence number has been reached; if so, the sequences are written to the VCA format file.

At step 490, which is the first in the series of steps outside of the MAIN LOOP, a check is performed to ensure that for each LOOP found a corresponding END LOOP was also found. If not, the process exits. Also, at step 492, the process checks if more than 2 nested loops were found, and, if so, the process exits.

Finally, moving to FIG. 4E, additional values and appropriate variables/structures are reset for the next run through the program and the process returns to the MAIN LOOP.

The present invention is further illustrated by way of example with reference to FIGS. 5A, 5B and 5C.

FIG. 5A shows a typical set of IMS format vectors which may be generated, stored in an *.IMS file, downloaded to the off-bench tester and applied to an IC to be tested. As shown in FIG. 5A, the test vectors are labelled horizontally and vertically. Each row, or test vector, represents the logical values to be applied to designated points on the IC, the circuit board, miscellaneous monitoring equipment, etc. at a given point in time. In the exemplary embodiment of the present invention, each row has two horizontal labels: the sequence number, Seq#, and the cycle number, Cyc#. The Seq# represents the listed test vector number and the Cyc# represents that actual number of test vectors which would exist if the instructions to the right of the test vectors (e.g., Repeat 3 Times) were expanded out.

The test vectors also have vertical labels which indicates the signal which is being represented by that particular position in the test vector. For example, the first signal label is IN_01 and the last signal label is TRIGR.

Using the IMS format vectors shown in FIG. 5A, if a user were to request 7 groups (e.g., IN_01, IN_02, GACLK, IN_09, GCCLK, IN_19 and TRIGR) and Seq# 1–9, FIG. 5B conceptually illustrates what the user has selected from the original IMS format test vector set shown in FIG. 5A. It shows the extracted subset of signals (7 of the original 20), the extracted subset of vector sequences (1 through 9) and the expansion of the "Repeat" and "Loop" pattern instructions.

FIG. 5C shows the actual output which would be generated by the present invention shown in FIGS. 4A–4E having processed the user inputs and the IMS format set of test vectors shown in FIG. 5A. To create the VCA format shown in FIG. 5C, as described in detail above, the present invention extracts, directly from the off-bench tester memory, the data related to the selected test vectors (shown in FIG. 5B) and converts it to the VCA format which, as seen from the table in FIG. 5C, appears quite different from the IMS format. The VCA format set of test vectors, among other things, includes a card designation (e.g., PGENA), a channel designation (e.g., CH1, each card has 4 channels), a signal name (e.g., IN_01), some miscellaneous information used by the stimulus generator and the data. It should be noted that, in the exemplary embodiment of the present invention, the off-bench tester can handle up to 8 characters for a signal name but the stimulus generator can only handle up to 5 characters for a signal name. Therefore, the present invention, during processing the IMS format test vectors, also abbreviates signal names longer than 5 characters in some meaningful way to comply with the 5 character maximum.

It is this VCA format set of test vectors which can then be downloaded to the stimulus generator and used for bench top testing.

It should be noted that the present invention is very effective because it bridges a gap between existing test equipment. It allows users of the various test configurations and test equipment to utilize the strengths of different test configurations. That is, the present invention allows a user to take advantage of the effectiveness of the off-bench tester for creating and debugging test vectors while also taking advantage of the performance and accuracy of bench top test equipment. The present invention provides an important savings in time when testing and characterizing electronic devices and, probably, makes practical work which would not otherwise be attempted.

The present invention has been described in terms of exemplary embodiments. It is contemplated, however, that it may be practiced with modifications, some of which are outlined above, within the scope of the appended claims.

What is claimed:

1. In an integrated circuit (IC) test environment which employs a plurality of different IC testers for testing the same IC, a method for converting a portion of a first set of test vectors compatible with one of said plurality of testers into a second format compatible with a second of said plurality of testers, said method comprising the steps of:

initiating user selections that identify all signals to be tested as said first set of test vectors and those that are to be tested in said second format by said second tester;

generating user selections that identify a portion of said first set of test vectors which are to be converted into said second format to be used to test said IC on said second tester;

proving said first set of test vectors to be satisfactory for test on said first and said second testers;

storing said first set of test vectors for subsequent use in said first tester;

extracting data from said stored set of test vectors necessary for conversion from said first test vectors directly to a set of second test vectors; and translating said extracted data into said second set of test vectors in a second format for subsequent use in a second tester.

2. The method of claim 1, wherein said step of translating further includes the step of expanding pattern instructions in said first set of test vectors into equivalent instructions in said second set of test vectors.

3. In an integrated circuit (IC) test environment which employs a plurality of different IC testers for testing the same IC, a system for converting a portion of a first set of test vectors compatible with one of said plurality of testers into a second format compatible with a second of said plurality of testers, said system comprising:

means for receiving user selections that identify the signal or signals to be formatted as a first set of test vectors some of which are to be tested by said second tester in a second format;

means for generating a first set of test vectors in response to said user selections and for identifying a portion of said first set of test vectors which are to be converted into said second format and used to test said IC on said second tester;

means for storing said first set of test vectors in a memory of said first tester, means for extracting conversion data from said first set of test vectors in said memory of said first tester; and means for converting said extracted data into test vectors in said second format.

4. The system of claim 3, further including means for expanding pattern instructions found in said first set of test vectors into equivalent instructions in said second format and for generating a second set of test vectors.

5. A method for testing integrated circuits (IC), said method comprising the steps of:

generating a first set of test vectors compatible with a first IC tester;

storing said first set of test vectors in a memory of said first IC tester;

executing a portion of said first set of test vectors on said first IC tester to perform first IC tests;

receiving user selections that identify a second portion of said first set of test vectors which are to be executed on a second IC tester, said second IC tester having testing capabilities not found in said first IC tester;

extracting data from the stored set of test vectors in the memory of said first IC tester;

converting said extracted data directly into test vectors in a second format compatible with said second IC tester;

storing a second set of test vectors in a memory of said second IC tester; and executing said second set of test vectors on said second IC tester to perform second IC tests.

* * * * *